United States Patent
Shoji

(10) Patent No.: US 7,023,299 B2
(45) Date of Patent: Apr. 4, 2006

(54) THIN-FILM COMMON MODE FILTER AND THIN-FILM COMMON MODE FILTER ARRAY

(75) Inventor: Shigeru Shoji, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 10/970,990

(22) Filed: Oct. 25, 2004

(65) Prior Publication Data

US 2005/0116793 A1    Jun. 2, 2005

(30) Foreign Application Priority Data

Nov. 28, 2003    (JP)    ............... 2003-398964

(51) Int. Cl.
*H03H 7/01*    (2006.01)
*H01F 5/00*    (2006.01)

(52) U.S. Cl. ............... 333/185; 333/181; 336/200
(58) Field of Classification Search ............... 333/181, 333/184, 185; 336/200, 232
See application file for complete search history.

(56) References Cited

U.S. PATENT DOCUMENTS 6,384,705 B1 * 5/2002 Huang et al. ............... 336/200
6,618,929 B1 * 9/2003 Kitamura ............... 336/200
6,710,694 B1 * 3/2004 Matsuta et al. ............... 336/200

FOREIGN PATENT DOCUMENTS

| JP | 04-364709 | 12/1992 |
| JP | 08-203737 | 8/1996 |
| JP | 08-335517 | 12/1996 |
| JP | 11-054326 | 2/1999 |

* cited by examiner

*Primary Examiner*—Seungsook Ham
(74) *Attorney, Agent, or Firm*—Buchanan Ingersoll PC

(57) ABSTRACT

A thin-film common mode filter is provided, comprising: a pair of magnetic plates; upper/lower coil conductors formed between the magnetic plates, spirally wound in the magnetic plate surface direction, overlapped each other; upper/lower lead conductors one ends of which are connected electrically to one ends in centers of the upper/lower coil conductors, respectively, extended to external portions across these coil conductors; an upper/lower lead drawing terminals to which the other ends of the upper/lower lead conductors are connected, respectively; an upper/lower coil drawing terminals to which the other ends of the upper/lower coil conductors are connected, respectively; and each of the lower lead/coil drawing terminals and the upper coil/lead drawing terminals having a structure where at least two of conductor layers to be patterned into the upper/lower lead conductors and the upper/lower coil conductors are stacked, and brought into conduction with each other.

22 Claims, 10 Drawing Sheets

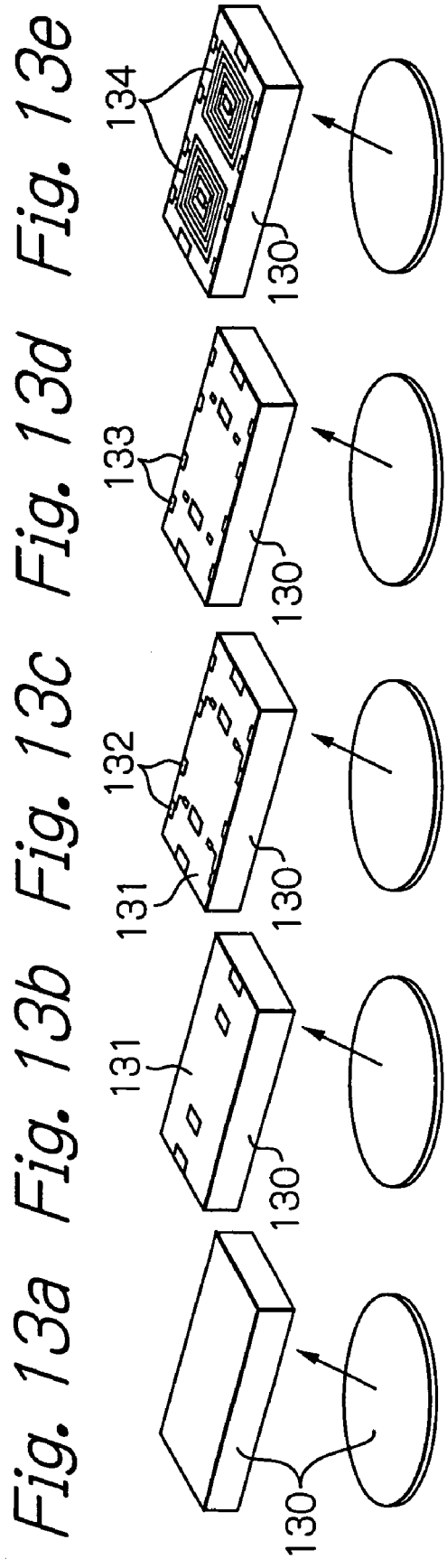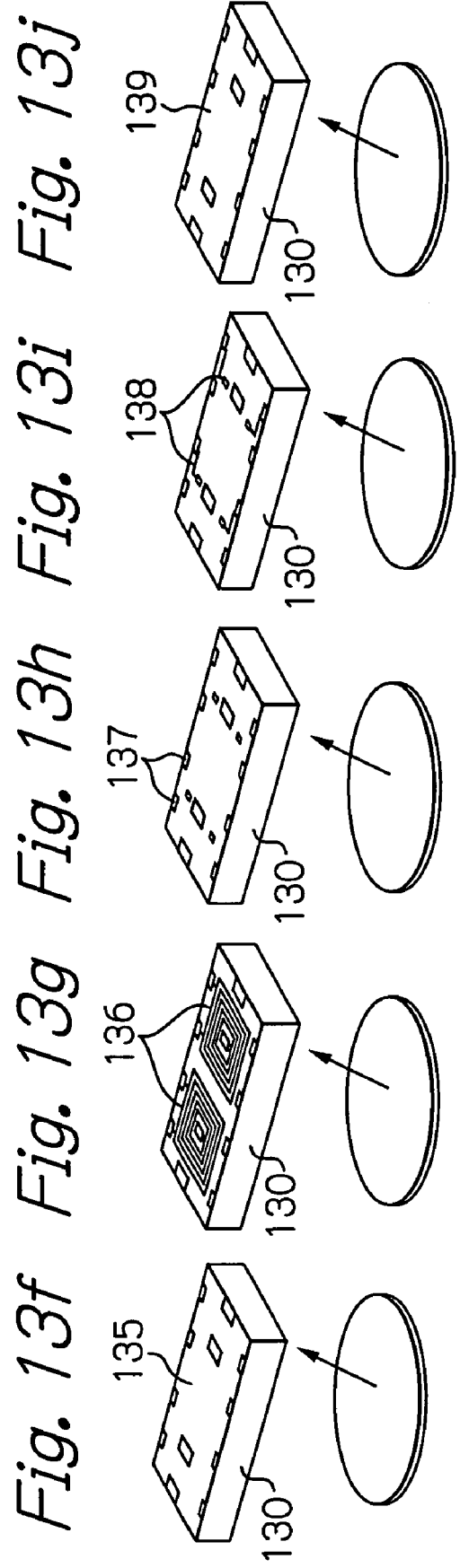

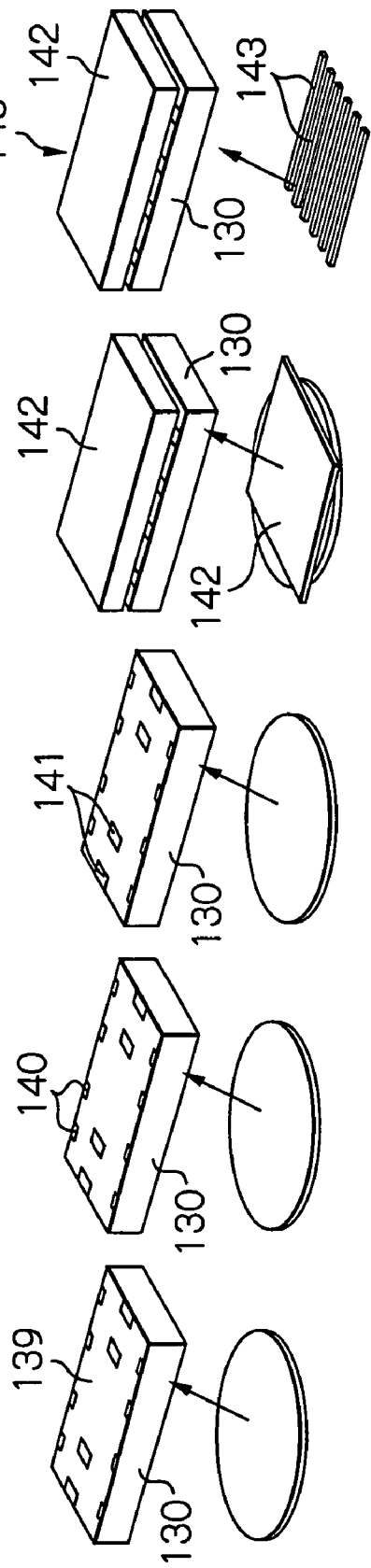
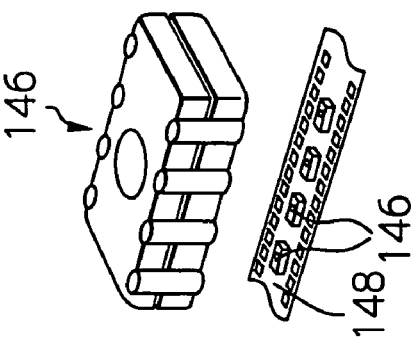
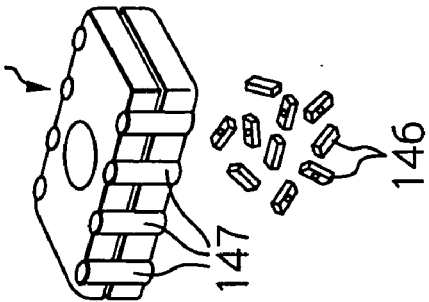
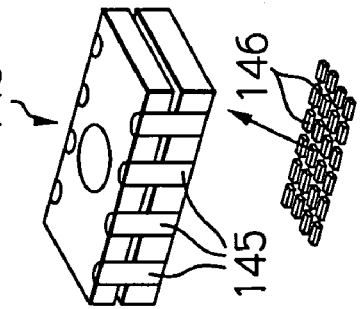
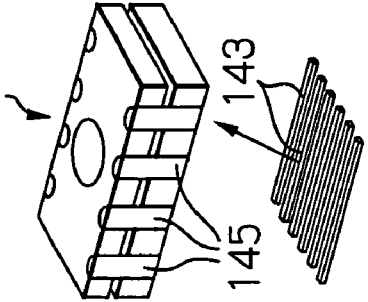
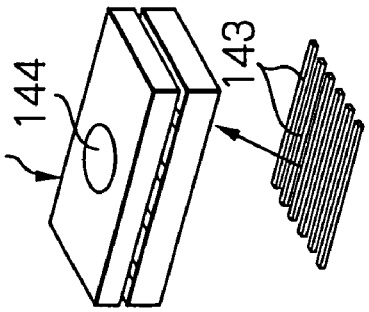

THIN-FILM COMMON MODE FILTER AND THIN-FILM COMMON MODE FILTER ARRAY

PRIORITY CLAIM

This application claims priority from Japanese patent application No. 2003-398964, filed on Nov. 28, 2003, which is incorporated herein by reference.

BACKGROUND OF THE INVENTION

1. Field of the Invention

The present invention relates to a thin-film common mode filter and a thin-film common mode filter array.

2. Description of the Related Art

Common mode filter is a device for suppressing common mode currents that cause electromagnetic interference in parallel transmission lines. The common mode filter has magnetically coupled inductors to remove in-phase noise component.

Thin-film common mode filter miniaturized and highly integrated by forming bilayered thin-film coils between ferrite substrates and by constructing in chip form, and thin film common mode filter array on which a plurality of the filters are mounted, are described in for example, Japanese Patent Publications Nos. 04-364709A, 08-203737A, 08-335517A and 11-054326A.

Generally, in such a thin-film common mode filter constructed in chip form, drawing terminals of outgoing parts from both ends of the thin-film coil are exposed on the side, and then external-connect electrode terminals are formed on the chip side so that they can be connected electrically to the exposed drawing terminals.

Conventional thin-film common mode filter, however, has small drawing terminals. Therefore, it has been a problem of reliability where, in some cases, the external-connect electrode terminal formed on the chip side has an incomplete electrical connection with the drawing terminal.

BRIEF SUMMARY OF THE INVENTION

It is therefore an object of the present invention to provide a thin-film common mode filter and a thin-film common mode filter array possessing an improved reliability in the electrical connection between the drawing terminals and the external-connect electrode terminals.

According to the present invention, a thin-film common mode filter and a thin-film common mode filter array comprised a plurality of the thin-film common mode filters are provided, the thin-film common mode filter comprising: a pair of magnetic plates; an upper coil conductor and a lower coil conductor formed between the pair of magnetic plates, spirally wound in the magnetic plate surface direction, and overlapped each other; an upper lead conductor and a lower lead conductor, one ends of which are connected electrically to one ends in center portions of the upper coil conductor and the lower coil conductor, respectively, and extended to external portions across the upper coil conductor and the lower coil conductor; an upper lead drawing terminal and a lower lead drawing terminal to which the other ends of the upper lead conductor and the lower lead conductor are connected, respectively; an upper coil drawing terminal and a lower coil drawing terminal to which the other ends of the upper coil conductor and the lower coil conductor are connected, respectively; and each of the lower lead drawing terminal, the lower coil drawing terminal, the upper coil drawing terminal and the upper lead drawing terminal having a structure where at least two of conductor layers to be patterned into the lower lead conductor, the lower coil conductor, the upper coil conductor and the upper lead conductor are stacked, and brought into conduction with each other.

Each of the drawing terminal is formed by stacking a plurality of the conductor layers to be patterned into the lower lead conductor, the lower coil conductor, the upper coil conductor and the upper lead conductor and bringing the conductor layers into conduction with each other. Therefore, because the side cross-sectional area of the drawing terminal, or the exposed area on the chip side, becomes larger, the drawing terminals and the external-connect electrode terminals have a much excellent electric connection between them, and a reliability in electric connection is greatly improved.

Preferably, each of the drawing terminal has a structure where all of the conductor layers to be patterned into the lower lead conductor, the lower coil conductor, the upper coil conductor and the upper lead conductor are stacked, and brought into conduction with each other.

It is also preferable that each of the lower lead drawing terminal, the lower coil drawing terminal, the upper coil drawing terminal and the upper lead drawing terminal has a structure where the conductor layers to be patterned into the lower lead conductor and the lower coil conductor are connected to each other via a through hole in a first layer, the conductor layers to be patterned into the lower coil conductor and the upper coil conductor are connected to each other via a through hole in a second layer, the conductor layers to be patterned into the upper coil conductor and the upper lead conductor are connected to each other via a through hole in a third layer, and all of these conductor layers are brought into conduction with each other.

More preferably, in the case, centers of the through holes in the first layer to the third layer coincide with each other. Then, the through holes in the first layer to the third layer may have the same form and the same dimension as each other, further more preferably, the through holes in the first layer to the third layer, that is, in the lower layer to the upper layer have sequentially larger dimensions. When the through holes have the same dimension as each other, the drawing terminal portion has a large step, then some insulating material is likely to remain in the through holes under an influence of reflections during exposure in photolithography, and therefore, a reliability in conduction is reduced (Especially, this problem becomes marked in the case of a high aspect-ratio pattern). However, by making the through holes in the lower layer to the upper layer sequentially larger, the step becomes smaller, and therefore, a reliability in the conduction between the layers is improved.

It is also preferable that each center position of the through holes in the first layer to the third layer is alternately changed. In the case, more preferably, the through holes in the first layer to the third layer have the same form and the same dimension as each other. By alternately changing the position of each center of the through holes, the dimple of the conductor in the through hole becomes smaller, then the surface of the insulating layer thereon becomes flatter, and therefore, the surfaces of the through hole conductors and of the insulating layers formed subsequently also become flatter. Consequently, a reliability in the conduction between the layers is improved, and the step becomes smaller.

Preferably, widths ($W_1$) of said upper and lower lead conductors are less than twice the widths ($W_2$) of said upper and lower coil conductors ($W_1 < 2W_2$). The higher aspect ratios (height/width) of the coil pattern and of the lead pattern cause smaller capacities between the coil conductors and between the coil conductor and the lead conductor. As the results, the high-frequency transmission properties are improved. However, the higher aspect ratio design makes it difficult to narrow the spacing between the lead conductor and the coil conductor. To solve the difficulty, narrowing the width of the lead conductor is effective. However, setting the width of the lead conductor ($W_1$) not less than twice the width of the coil conductor ($W_2$) lowers the resonance frequency to a large degree. Therefore, by setting $W_1 < 2W_2$, the thin-film common mode filter showing less decrease in the resonance frequency can be provided.

Preferably, the lower and upper lead conductors are formed of a copper (Cu) whose external surfaces are covered with nickel(Ni)/chromium(Cr) films. In the case, more preferably, a surface of the lower lead conductor in a connection portion between the lower coil conductor and the lower lead conductor, and a surface of the upper lead conductor in a connection portion between the upper coil conductor and the upper lead conductor, are covered with only chromium (Cr) films. A trouble of an electric resistance increase caused by the diffusion between Cu/Ni can be avoided because Ni is eliminated in the connection portion.

Further objects and advantages of the present invention will be apparent from the following description of the preferred embodiments of the invention as illustrated in the accompanying drawings.

BRIEF DESCRIPTION OF THE SEVERAL VIEWS OF THE DRAWINGS

FIGS. 13a to 13j show perspective views for explanation of a wafer process to produce the thin-film common mode filter array; and FIGS. 14a to 14j show perspective views for explanation of a working process to produce the thin-film common mode filter array.

DETAILED DESCRIPTION OF THE INVENTION

Figure 1:
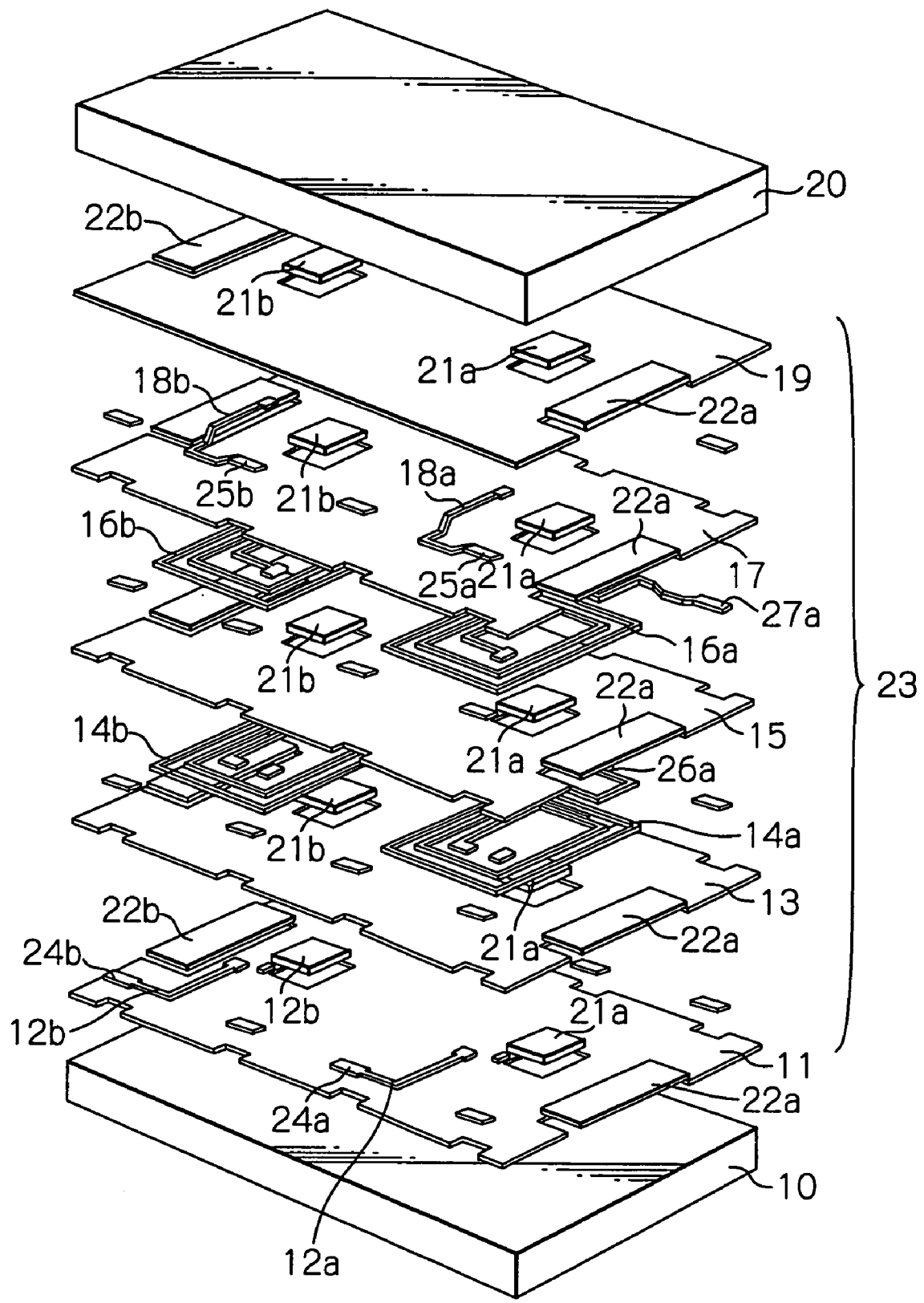
FIG. 1 shows an exploded perspective view schematically illustrating a structure of a thin-film common mode filter array according to an embodiment of the present invention.
Figure 2:
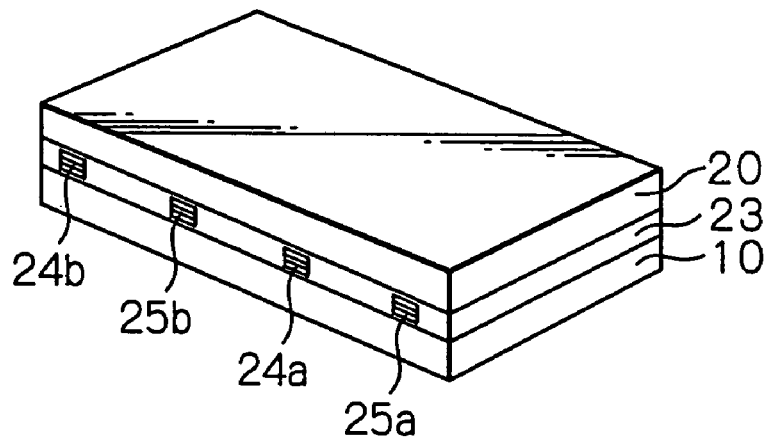
FIG. 2 shows a perspective view schematically illustrating an appearance of a thin-film common mode filter array when cut out of a wafer.
Figure 3:
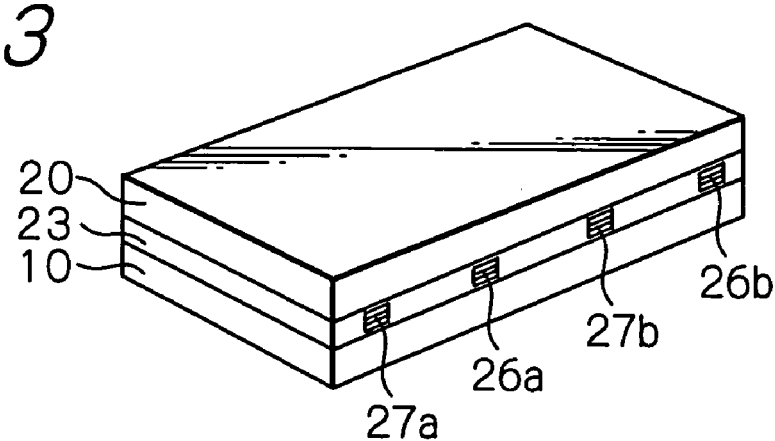
FIG. 3 shows another perspective view from the different direction from that in FIG. 2, schematically illustrating an appearance of a thin-film common mode filter array when cut out of a wafer.
Figure 4:
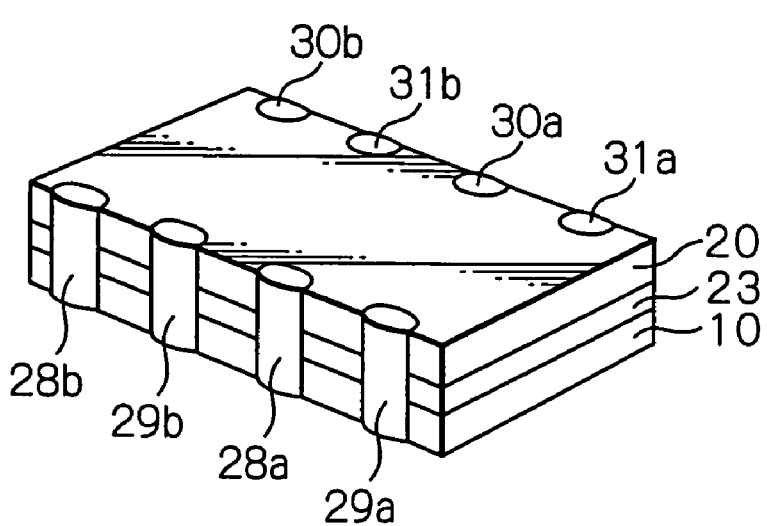
FIG. 4 shows a perspective view schematically illustrating an appearance of the finished-up thin-film common mode filter array.

FIG. 1 shows an exploded perspective view schematically illustrating a structure of a thin-film common mode filter array according to an embodiment of the present invention. FIG. 2 shows a perspective view schematically illustrating an appearance of a thin-film common mode filter array when cut out of a wafer. FIG. 3 shows another perspective view from the different direction from that in FIG. 2, schematically illustrating an appearance of a thin-film common mode filter array when cut out of a wafer. FIG. 4 shows a perspective view schematically illustrating an appearance of a finished-up thin-film common mode filter array.

The thin-film common mode filter array is formed as a chip by aligning two thin-film common mode filters.

In FIG. 1, reference numeral 10 indicates an insulating magnetic substrate, 11 indicates a first insulating layer usually formed of a polyimide or a BCB (benzocyclobutene) that have great heat-resistance, stacked on the insulating magnetic substrate 10, 12a and 12b indicate a lower lead conductor formed on the first insulating layer 11, 13 indicates a second insulating layer stacked thereon, 14a and 14b indicate a lower coil conductor with spiral form formed on the second insulating layer 13, 15 indicates a third insulating layer stacked thereon, 16a and 16b indicate an upper coil conductor with spiral form formed on the third insulating layer 15, 17 indicates a fourth insulating layer stacked thereon, 19 indicates a fifth insulating layer stacked thereon, 20 indicates a insulating magnetic top-side board, 21a and 21b indicate an insulating magnetic material constituting a return portion of a magnetic path in the center portion of the coil, and 22a and 22b indicate an insulating magnetic material constituting a return portion of a magnetic path in the periphery of the coil, respectively.

As just described, the laminate 23 is sandwiched between the insulating magnetic substrate 10 and the insulating magnetic top-side board 20.

The lower coil conductors 14a and 14b spirally wound in the substrate direction, and the upper coil conductors 16a and 16b spirally wound in the substrate direction, are positioned in mirror symmetry to each other with the third insulating layer 15 sandwiched between them.

The lower lead conductors 12a and 12b formed of the different layer from the layer patterned into the lower coil conductors 14a and 14b lead conductive paths, via the second insulating layer 13, from one ends in center portions of these coil conductors into the outsides of their spiral areas, respectively. Correspondingly, The upper lead conductors 18a and 18b formed of the different layer from the layer patterned into the upper coil conductors 16a and 16b lead conductive paths, via the fourth insulating layer 17, from one ends in center portions of these coil conductors into the outsides of the spiral areas, respectively. In other words, one ends of the lead conductors 12a, 12b, 18a and 18b are connected electrically, via through holes, to the ends in center portions of the coil conductors 14a, 14b, 16a and 16b, respectively, and then these ends constitute contact portions. The other ends of the lead conductors 12a, 12b, 18a and 18b are connected electrically to lead drawing terminals 24a, 24b, 25a and 25b (FIG. 2) formed in the side edge portion of the thin-film common mode filter array, respectively. Correspondingly, the other ends of the coil conductors 14a, 14b, 16a and 16b are connected electrically to the coil drawing terminals 26a, 26b, 27a and 27b (FIG. 3) formed in the side edge portion of the thin-film common mode filter array, respectively.

The insulating magnetic substrate 10 and the insulating magnetic top-side board 20 are usually formed of a NiZn ferrite. The first to fifth insulating layers 11, 13, 15, 17 and 19 are usually formed of a polylmide or a BCB (benzocyclobutene) that have great heat-resistance.

The lower lead conductors 12a and 12b, the lower coil conductors 14a and 14b, the upper coil conductors 16a and 16b and the upper lead conductors 18a and 18b are formed of Cu, the external surfaces of which are covered with Ni/Cr films. However, the respective contact portions between the lower lead conductors 12a and 12b and the lower coil conductors 14a and 14b, and the respective contact portions between the upper coil conductors 16a and 16b and the upper lead conductors 18a and 18b, are covered with only Cr films.

In each of the thin-film common mode filter arrays, as shown in FIGS. 2 and 3, the insulating magnetic substrate 10, the laminate 23 and the insulating magnetic top-side board 20 are cut out, and then, as shown in FIG. 4, connect electrode terminals 28a, 28b, 29a, 29b, 30a, 30b, 31a and 31b formed of such as a Ni alloy for being connected electrically to the drawing terminals exposed on the cut side-surfaces, are formed on the cut side-surfaces.

Figure 5:
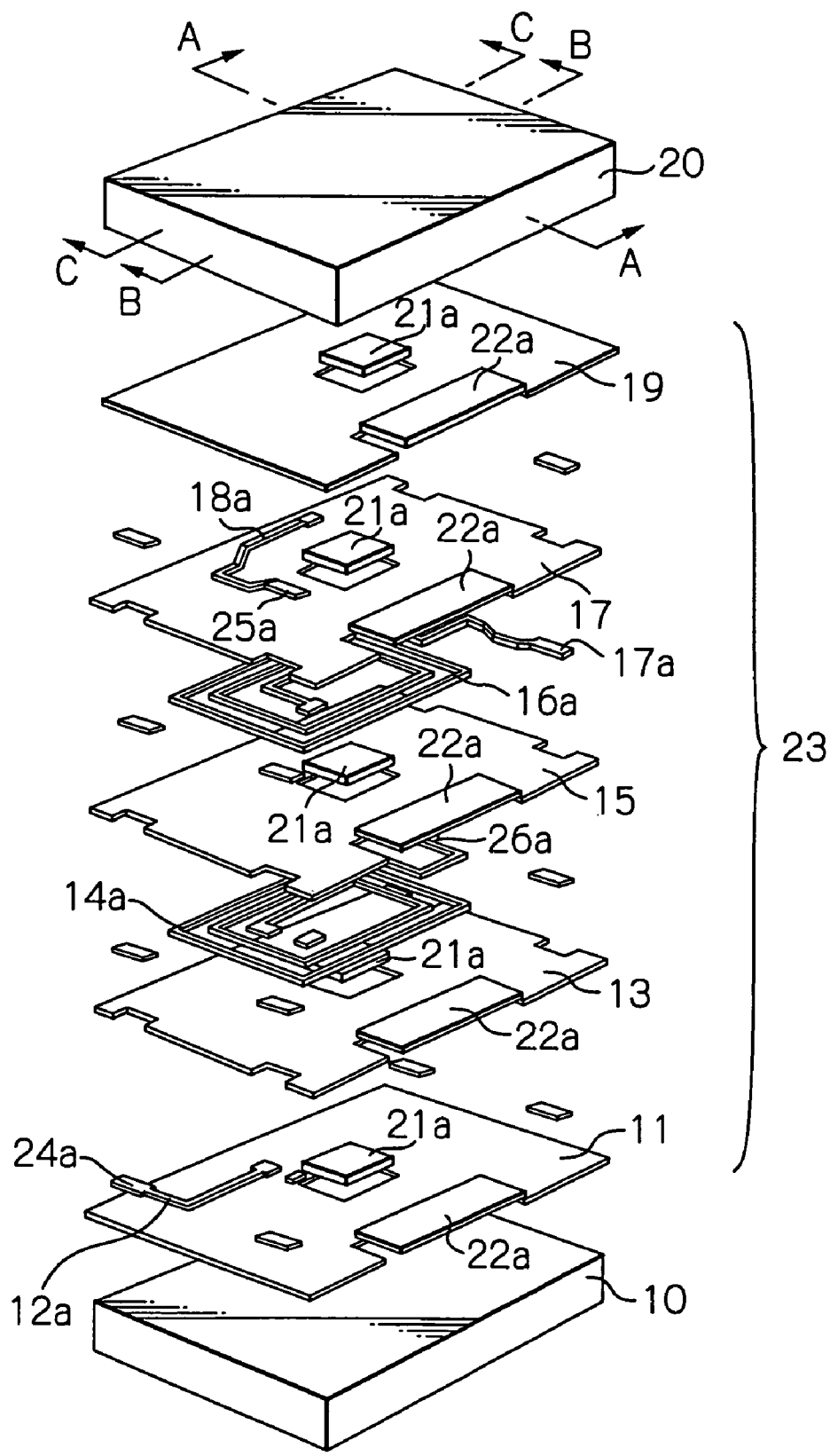
FIG. 5 shows an exploded perspective view schematically illustrating a structure of a thin-film common mode filter consisting of a single-element in the thin-film common mode filter array in FIG. 1.
Figure 6:
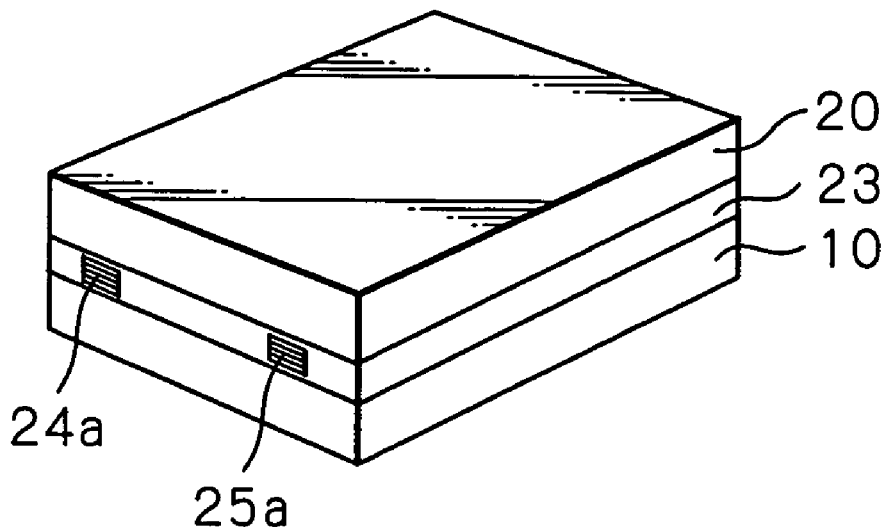
FIG. 6 shows a perspective view schematically illustrating an appearance of the thin-film common mode filter when cut out of a wafer.
Figure 7:
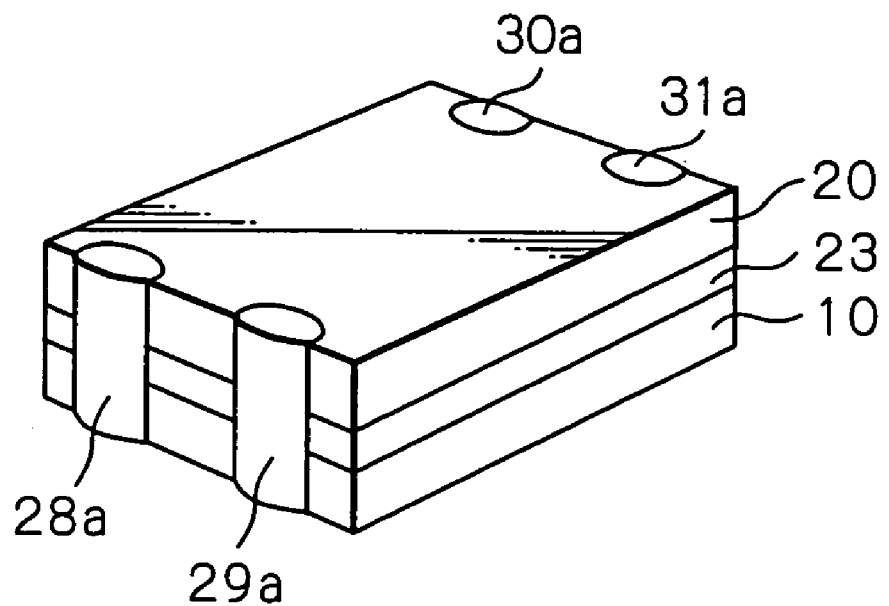
FIG. 7 shows a perspective view schematically illustrating an appearance of the finished-up thin-film common mode filter.

A single thin-film common mode filter may be included in the chip. FIG. 5 shows an exploded perspective view schematically illustrating a structure of a thin-film common mode filter consisting of the single-element. FIG. 6 shows a perspective view schematically illustrating an appearance of the thin-film common mode filter when cut out of a wafer. FIG. 7 shows a perspective view schematically illustrating an appearance of the finished-up thin-film common mode filter. FIG. 8 shows a cross-sectional view of the thin-film common mode filter taken along line A—A, line B—B and line C—C in FIG. 5.

The structure of the thin-film common mode filter is the same as that of the thin-film common mode filter as one-half of the thin-film common mode filter array shown in FIGS. 1 to 3. Therefore, in FIGS. 5 to 8, the same elements as those in FIG. 1 have been referred to with same reference numerals.

Figure 8A:
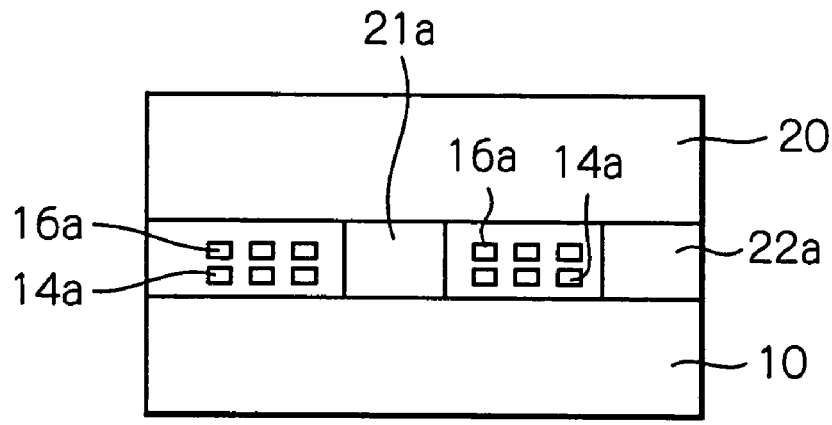
FIGS. 8a to 8c show cross-sectional views of the thin-film common mode filter taken along line A—A, line B—B and line C—C in FIG. 5.

FIG. 8a shows a cross-sectional view taken along line A—A in FIG. 5, illustrating the center cross-section having no drawing terminals. On the cross-section, appear the lower coil conductor 14a, the upper coil conductor 16a, the insulating magnetic material 21a constituting a return portion of a magnetic path in the center portion of the coil, and the insulating magnetic material 22a constituting a return portion of a magnetic path in the periphery of the coil.

Figure 8B:
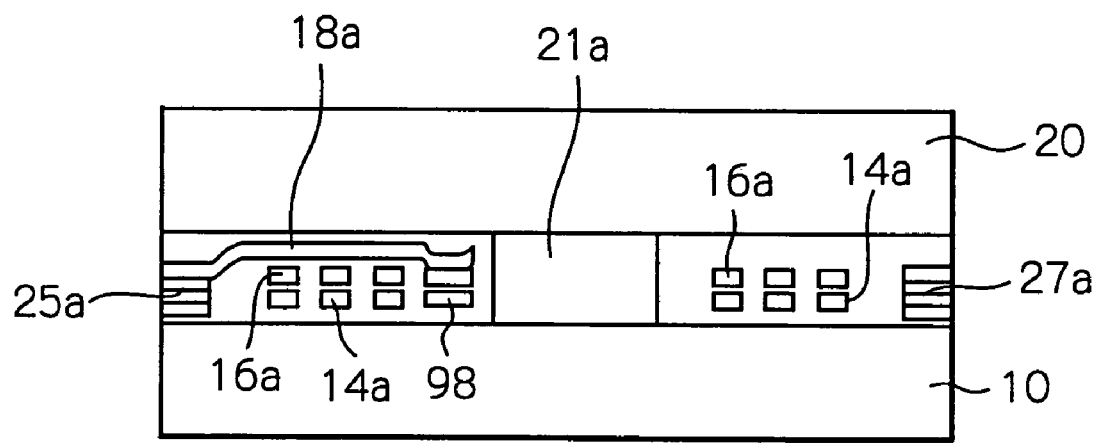

FIG. 8b shows a cross-sectional view taken along line B—B in FIG. 5, illustrating the cross-section having the drawing terminals and the upper lead conductor. On the cross-section, appear the lower coil conductor 14a, the upper coil conductor 16a, the upper lead conductor 18a, the upper lead drawing terminal 25a, the upper coil drawing terminal 27a, and the insulating magnetic material 21a constituting a return portion of a magnetic path in the center portion of the coil.

Figure 8C:
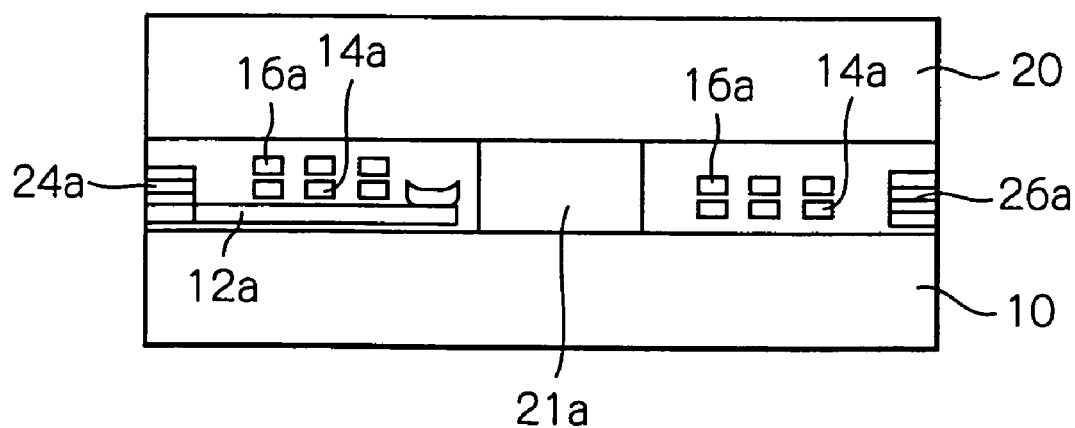

FIG. 8c shows a cross-sectional view taken along line C—C in FIG. 5, which illustrates the cross-section having the drawing terminals and the lower lead conductor. On the cross-section, appear the lower coil conductor 14a, the upper coil conductor 16a, the lower lead conductor 12a, the lower lead drawing terminal 24a, the lower coil drawing terminal 26a, and the insulating magnetic material 21a constituting a return portion of a magnetic path in the center portion of the coil.

Then, the structures of the lead drawing terminals 24a, 24b, 25a and 25b, and of the coil drawing terminal 26a, 26b, 27a and 27b, according to the present embodiment will be described.

Figure 9:
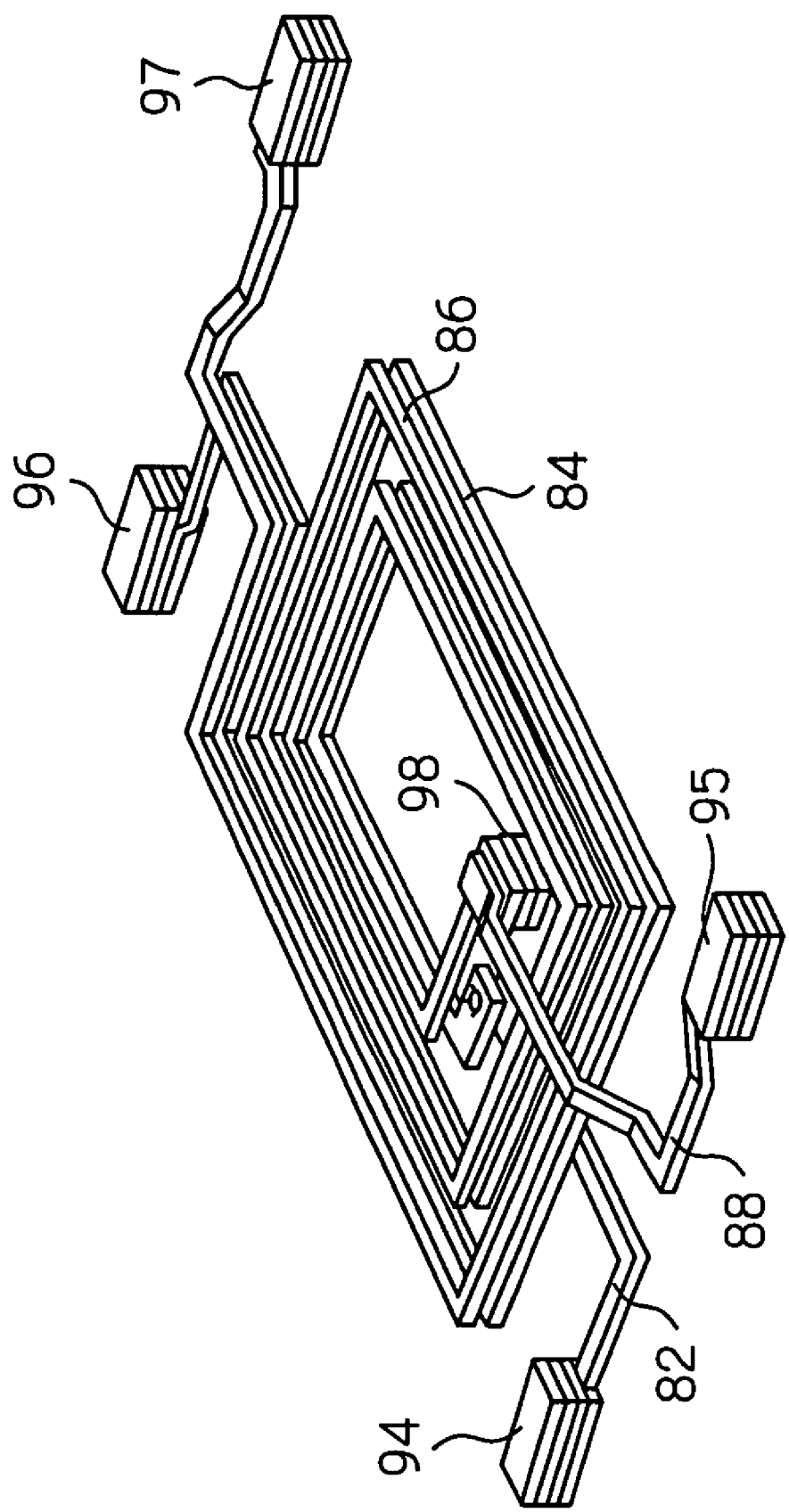
FIG. 9 shows a perspective view schematically illustrating structures only of the coil conductors, the lead conductors and the drawing terminals in the thin-film common mode filter according to the embodiment in FIGS. 1 and 5.

FIG. 9 shows a perspective view schematically illustrating structures only of the coil conductors, the lead conductors and the drawing terminals in the thin-film common mode filter according to the present embodiment. FIG. 10 shows cross-sectional views of structure examples of the drawing terminal.

In FIG. 9, reference numeral 82 indicates a lower lead conductor, 84 indicates a lower coil conductor, one end in the center portion of which is connected to one end of the lower lead conductor 82, 86 indicates an upper coil conductor, 88 indicates an upper lead conductor, one end of which is connected to one end in the center portion of the upper coil conductor 86, 94 indicates a lower lead drawing terminal connected to the other end of the lower lead conductor 82, 95 indicates an upper lead drawing terminal connected to the other end of the upper lead conductor 88, 96 indicates a lower coil drawing terminal connected to the other end in the outside of the lower coil conductor 84, and 97 indicates an upper coil drawing terminal connected to the other end in the outside of the upper coil conductor 86, respectively.

Each drawing terminal has a multilayered structure, not a monolayer structure having only its own conductor layer, where all the other conductor layers are stacked via through holes formed in the insulating layers interlayered between these conductor layers, and brought into conduction with each other. In other words, the lower lead drawing terminal 94 has a structure where the conductor layers to be patterned into the lower lead conductor 82, the lower coil conductor 84, the upper coil conductor 86 and the upper lead conductor 88 are multilayered and brought into conduction with each other. Therefore, because the side cross-sectional area of the drawing terminal, or the exposed area on the chip side, becomes larger, the drawing terminals and the external-connect electrode terminals have a much excellent electric connection between them, and a reliability in electric connection is greatly improved.

Figure 10A:
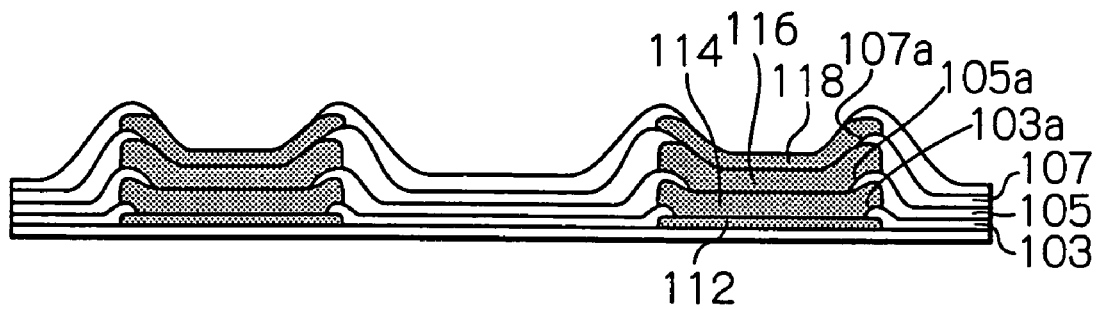
FIGS. 10a to 10c show cross-sectional views of a structure example of the drawing terminal.

As an embodiment of the multilayered structure of the conductor layers, as shown in FIG. 10a, conductor layers 112, 114, 116 and 118 are preferably connected to brought into conduction with each other via through holes 103a, 105a and 107a formed in a second insulating layer 103, a third insulating layer 105 and a fourth insulating layer 107, respectively, the through holes having an identical center, the same form and the same dimension as each other.

Figure 10B:
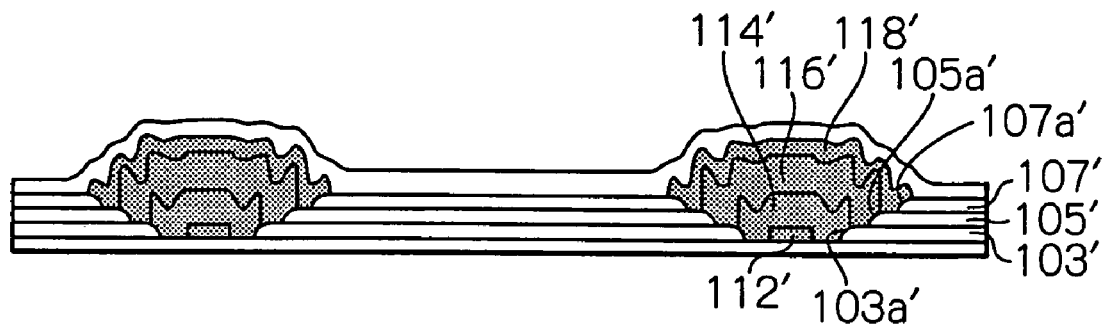

Further, as shown in FIG. 10b, conductor layers 112', 114', 116' and 118' are preferably connected to brought into conduction with each other via through holes 103a', 105a' and 107a' formed in a second insulating layer 103', a third insulating layer 105' and a fourth insulating layer 107', respectively, the through holes 103a', 105a' and 107a' in the lower layer to the upper layer having an identical center and sequentially larger dimensions. When the through holes have the same dimension as each other like the structure in FIG. 10a, the drawing terminal portion has a large step, then some insulating material is likely to remain in the through holes under an influence of reflections during exposure in photolithography, and therefore, a reliability in conduction is reduced. Especially, this problem becomes marked in the case of a high aspect-ratio pattern. However, by making the through holes in the lower layer to the upper layer sequentially larger, the step becomes smaller, and therefore, a reliability in the conduction between the layers is improved.

Figure 10C:
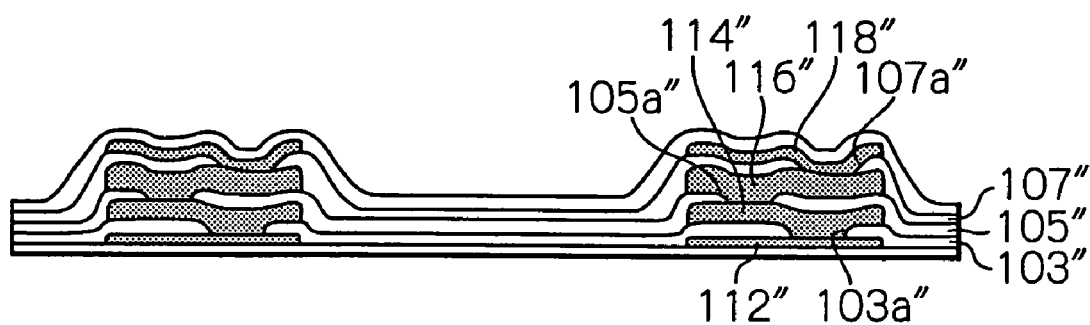

Furthermore, as shown in FIG. 10c, conductor layers 112", 114", 116" and 118" are preferably connected to brought into conduction with each other via through holes 103a", 105a" and 107a" formed in a second insulating layer 103", a third insulating layer 105" and a fourth insulating layer 107", respectively, each center position of the through holes alternately changed. The through holes 103a", 105a" and 107a" preferably have the same form and the same dimension as each other, or also preferably have rather different forms and dimensions from each other. Because the distance between the terminals is short in the thin-film common mode filter, the through holes in the lower layers become too small where the through holes in the lower layer to the upper later are made sequentially larger like the structure in FIG. 10b. Therefore, it is difficult to improve a reliability in the conduction between the layers. Further, because the through holes in the upper layer to the lower layer have sequentially smaller dimensions, the formed insulating layer has a dimple in the center portion and a narrow through hole pattern. Therefore, some residual insulating layer material or the like causes a high reliable performance of the conduction in the through hole to be more difficult. However, by alternately changing the position of each center of the through holes like the structure in FIG. 10c, the dimple in the through hole becomes smaller, and then the surface of the insulating layer thereon becomes flatter, and therefore, the surfaces of the through hole conductors and of the insulating layers formed subsequently also become flatter. Consequently, a reliability in the conduction between the layers is improved, and the step becomes smaller.

Then, the structure of the contact portion as the connection portion between the upper coil conductor and the upper lead conductor according to the present embodiment will be described.

Smaller capacities between the coil conductors and between the coil conductor and the lead conductor effectively improve high-frequency properties of the thin-film common mode filter. However, higher aspect ratio, that is height/width, in the coil and lead patterns for the improvement cause the tolerance of the optimum exposure conditions for forming the contact holes as the connection portions between the upper coil conductors and the upper lead conductors to be unlimitedly lower. More specifically, an insulating film (photosensitive resin film) is applied inevitably thickly in the contact hole portion under an influence of the adjacent coil during the process. Therefore, an amount of light exposure is needed to increase according to the deepest portion of the film to form the high-precision contact holes. However, under the condition of an increased amount of light exposure, the light is overreached to the contact hole portions to be kept unexposed just under mask patterns, by reflections from the adjacent coil or the like, and as the results, the photosensitive insulating film in the contact hole portion becomes difficult to be dissolved during development. Therefore, a reliability in conduction is reduced. Under the opposite condition of a decreased amount of light exposure for the purpose of preventing the influence of reflections from the adjacent coil, the contact hole becomes larger because of less exposure on the periphery of the contact hole. Further, the decreased amount of light exposure causes a thickness decrease of the photosensitive insulating film during development and fails to maintain a pattern accuracy of the insulating film. At worst, the thickness decrease of the insulating film is likely to cause an insulation failure between the upper coil conductor and the upper lead conductor.

To solve the problems, according to the present embodiment, as shown in FIGS. 8a and 9, a pedestal part 98 is formed below the contact hole between the upper coil conductor 16a or 86 and upper lead conductor 18a or 88, by which the insulating bottom portion underneath the contact hole is lifted up as much as possible. Therefore, because an amount of light exposure during the contact hole formation is not needed to increase, the disadvantage such as the lowering reliability in conduction and the insulation failure can be resolved. Particularly, according to present embodiment, because the pedestal part 98 is formed of the conductor layers to be patterned into the lower coil conductor 14a or 84 and the lower lead conductor 12a or 82, there is no need to add a special process for forming the pedestal part.

Figure 11:
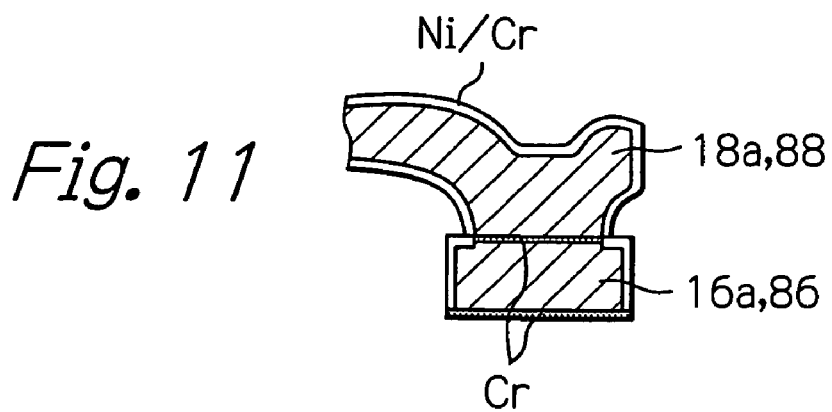
FIG. 11 shows a magnified cross-sectional view illustrating a contact portion between the upper coil conductor and the upper lead conductor.

As described above, main bodies of the lower lead conductor 12a or 82, the lower coil conductor 14a or 84, the upper coil conductor 16a or 86, and the upper lead conductor 18a or 88 are formed of Cu, and their external surfaces are covered with Ni/Cr films. However, as shown in FIG. 11, the contact portion between the upper coil conductor 16a or 86 and the upper lead conductor 18a or 88 is covered with only a Cr film. The same is true of the contact portion between the lower lead conductor 12a or 82 and the lower coil conductor 14a or 84. Thus, a disadvantage of an electric resistance increase caused by the diffusion between Cu/Ni is avoided because Ni is eliminated in the contact portion.

Then, a relation between widths of the upper and lower lead conductors and widths of the upper and lower coil conductors according to the present embodiment will be described.

As described above, the higher aspect ratios (height/width) of the coil pattern and of the lead pattern in the thin-film common mode filter cause smaller capacities between the coil conductors and between the coil conductor and the lead conductor. As the results, the high-frequency transmission properties are improved. However, the high aspect ratio design makes it difficult to narrow spacings between the lead conductors and the coil conductors. To solve the difficulty, narrowing widths of the lead conductors is effective.

Figure 12:
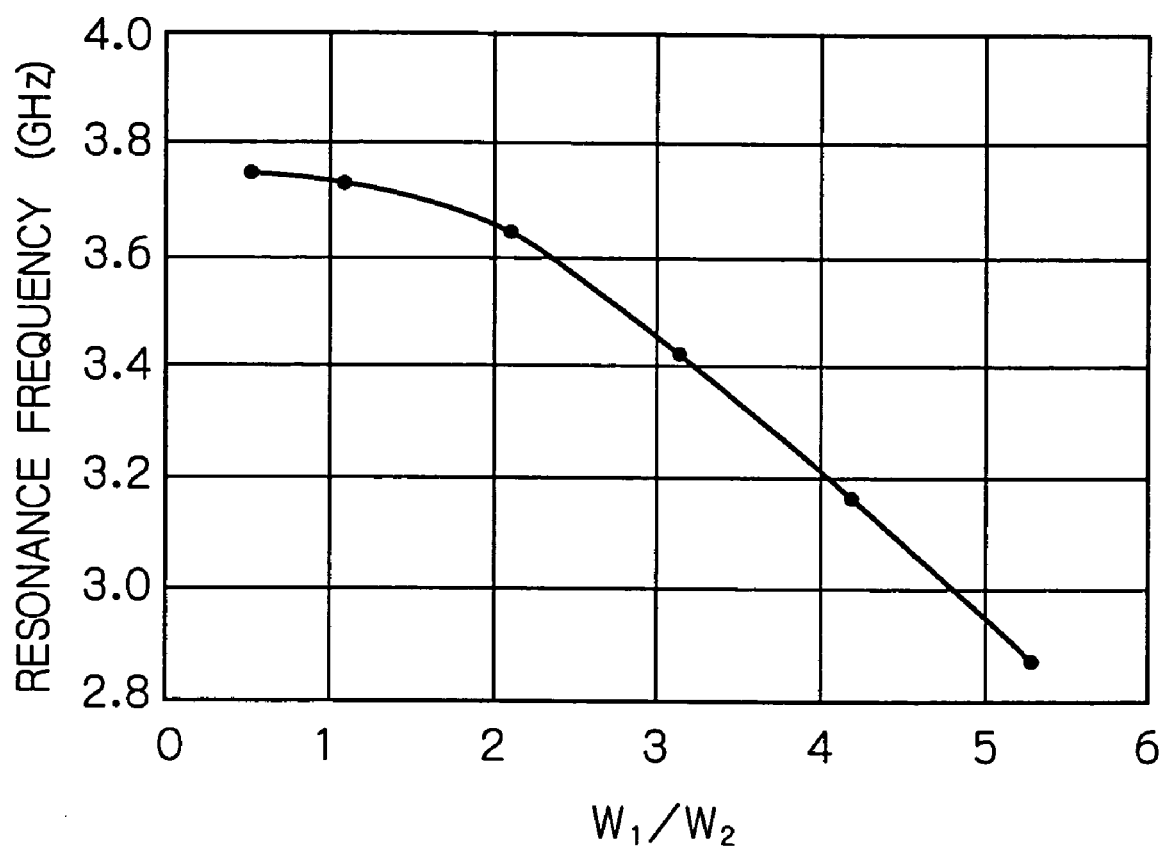
FIG. 12 shows a characteristic graph illustrating a relation between a resonance frequency of the thin-film common mode filter and a width of the lead conductor.

FIG. 12 shows a characteristic graph illustrating a relation between a resonance frequency of the thin-film common mode filter and the width of the lead conductor. The lateral axis of the graph indicates a ratio ($W_1/W_2$) between the width of the lead conductor ($W_1$) and the width of the coil conductor ($W_2$), and the longitudinal axis indicates a resonance frequency.

As understood form the Figure, setting the width of the lead conductor ($W_1$) not less than twice the width of the coil conductor ($W_2$) lowers the resonance frequency to a large degree. Therefore, by setting $W_1 < 2W_2$, the thin-film common mode filter having an enough high resonance frequency, more specifically, showing no resonance frequency in proximity to 2 GHz used as a communication frequency band can be provided.

Then, a manufacturing process of the thin-film common mode filter array according to the present embodiment will be described.

FIGS. 13 and 14 show perspective views for explanation of a wafer process and a working process to produce the thin-film common mode filter array, respectively. In FIGS. 13a–13j and FIGS. 14a–14d, a lower part of the view shows a wafer, and an upper part shows individual chips in the substrate that are not actually cut to separate.

First, as shown in FIG. 13a, a ferrite wafer 130 is prepared, and, as shown in FIG. 13b, a first insulating layer 131 made of such as a polyimide resin is coated on the wafer 130, and is then patterned.

Next, as shown in FIG. 13c, first leads and electrodes made of a copper layer 132 are formed on the first insulating layer 131. Then, as shown in FIG. 13d, a second insulating layer 133 made of such as a polyimide resin is coated thereon, and patterned.

Then, as shown in FIG. 13e, first coils made of a copper layer 134 are formed on the second insulating layer 133. Then, as shown in FIG. 13f, a third insulating layer 135 made of such as a polyimide resin is coated thereon, and patterned.

Then, as shown in FIG. 13g, second coils made of a copper layer 136 are formed on the third insulating layer 135. Then, as shown in FIG. 13h, a fourth insulating layer 137 made of such as a polyimide resin is coated thereon, and patterned.

Then, as shown in FIG. 13i, second leads made of a copper layer 138 are formed on the fourth insulating layer 137. Then, as shown in FIGS. 13j and 14a, a fifth insulating layer 139 made of such as a polyimide resin is coated thereon, and patterned.

After that, as shown in FIG. 14b, silver pastes 140 are screen-printed on the lead portions. Then, as shown in FIG. 14c, ferrite pastes 141 for return portions of the magnetic paths are embedded in the core portions.

Then, as shown in FIG. 14d, a ferrite plate cover 142 is bonded on the processed wafer with an adhesive.

Then, as shown in FIG. 14e, the obtained wafer is cut into bars 143 on each of which a plurality of thin-film common mode filter array chips are aligned.

Then, as shown in FIG. 14f, a mark 144 is printed on the upper side of each of the thin-film common mode filter array chips in the bar 143. Then, as shown in FIG. 14g, connect electrode terminals 145 made of Ni are formed by sputtering on the side of each of the thin film common mode filter array chips in the bar 133.

After that, as shown in FIG. 14h, each bar is cut to separate into individual chips 146. Then, as shown in FIG. 14i, the connect electrode terminals 145 are formed into bilayer structure 147 of a Nickel layer and a tin layer by barrel plating. Further, as shown in FIG. 14j, the obtained thin-film common mode filter array chips 146 are bonded on a tape 148.

All the foregoing embodiments are by way of example of the present invention only and not intended to be limiting, and many widely different alternations and modifications of the present invention may be constructed without departing from the spirit and scope of the present invention. Accordingly, the present invention is limited only as defined in the following claims and equivalents thereto.

The invention claimed is:
1. A thin-film common mode filter comprising:
 a pair of magnetic plates;
 an upper coil conductor and a lower coil conductor formed between said pair of magnetic plates, spirally wound in said magnetic plates surface direction, and overlapped each other;
 an upper lead conductor and a lower lead conductor, one ends of said upper lead conductor and said lower lead conductor connected electrically to one ends in center portions of said upper coil conductor and said lower coil conductor, respectively, and extended to external portions across said upper coil conductor and said lower coil conductor;
 an upper lead drawing terminal and a lower lead drawing terminal, the other ends of said upper lead conductor and said lower lead conductor connected to said upper lead drawing terminal and said lower lead drawing terminal, respectively;
 an upper coil drawing terminal and a lower coil drawing terminal, the other ends of said upper coil conductor and said lower coil conductor connected to said upper coil drawing terminal and said lower coil drawing terminal, respectively; and
 each of said lower lead drawing terminal, said lower coil drawing terminal, said upper coil drawing terminal and said upper lead drawing terminal having a structure where at least two of conductor layers to be patterned into said lower lead conductor, said lower coil conductor, said upper coil conductor and said upper lead conductor are stacked, and brought into conduction with each other.

2. The thin-film common mode filter as claimed in claim 1, wherein each of said lower lead drawing terminal, said lower coil drawing terminal, said upper coil drawing terminal and said upper lead drawing terminal has a structure where all of said conductor layers to be patterned into said lower lead conductor, said lower coil conductor, said upper coil conductor and said upper lead conductor are stacked, and brought into conduction with each other.

3. The thin-film common mode filter as claimed in claim 2, wherein each of said lower lead drawing terminal, said lower coil drawing terminal, said upper coil drawing terminal and said upper lead drawing terminal has a structure where said conductor layers to be patterned into said lower lead conductor and said lower coil conductor are connected to each other via a through hole in a first layer, said conductor layers to be patterned into said lower coil conductor and said upper coil conductor are connected to each other via a through hole in a second layer, said conductor layers to be patterned into said upper coil conductor and said upper lead conductor are connected to each other via a through hole in a third layer, and all of said conductor layers are brought into conduction with each other.

4. The thin-film common mode filter as claimed in claim 3, wherein centers of said through holes in said first layer to said third layer coincide with each other.

5. The thin-film common mode filter as claimed in claim 4, wherein said through holes in said first layer to said third layer have sequentially larger dimensions.

6. The thin-film common mode filter as claimed in claim 4, wherein said through holes in said first layer to said third layer have the same form and the same dimension as each other.

7. The thin-film common mode filter as claimed in claim 3, wherein each center position of said through holes in said first layer to said third layer is alternately changed.

8. The thin-film common mode filter as claimed in claim 7, wherein said through holes in said first layer to said third layer have the same form and the same dimension as each other.

9. The thin-film common mode filter as claimed in claim 1, wherein widths ($W_1$) of said upper and lower lead conductors are less than twice the widths ($W_2$) of said upper and lower coil conductors ($W_1 < 2W_2$).

10. The thin-film common mode filter as claimed in claim 1, wherein said lower and upper lead conductors are formed of a copper whose external surfaces are covered with nickel/chromium films.

11. The thin film common mode filter as claimed in claim 10, wherein a surface of said lower lead conductor in a connection portion between said lower coil conductor and said lower lead conductor, and a surface of said upper lead conductor in a connection portion between said upper coil conductor and said upper lead conductor, are covered with only chromium films.

12. A thin-film common mode filter array comprising a plurality of thin-film common mode filters comprising:
- a pair of magnetic plates;
- an upper coil conductor and a lower coil conductor formed between said pair of magnetic plates, spirally wound in said magnetic plates surface direction, and overlapped each other;
- an upper lead conductor and a lower lead conductor, one ends of said upper lead conductor and said lower lead conductor connected electrically to one ends in center portions of said upper coil conductor and said lower coil conductor, respectively, and extended to external portions across said upper coil conductor and said lower coil conductor;
- an upper lead drawing terminal and a lower lead drawing terminal, the other ends of said upper lead conductor and said lower lead conductor connected to said upper lead drawing terminal and said lower lead drawing terminal, respectively;
- an upper coil drawing terminal and a lower coil drawing terminal, the other ends of said upper coil conductor and said lower coil conductor connected to said upper coil drawing terminal and said lower coil drawing terminal, respectively; and
- each of said lower lead drawing terminal, said lower coil drawing terminal, said upper coil drawing terminal and said upper lead drawing terminal having a structure where at least two of conductor layers to be patterned into said lower lead conductor, said lower coil conductor, said upper coil conductor and said upper lead conductor are stacked, and brought into conduction with each other.

13. The thin-film common mode filter array as claimed in claim 12, wherein each of said lower lead drawing terminal, said lower coil drawing terminal, said upper coil drawing terminal and said upper lead drawing terminal has a structure where all of said conductor layers to be patterned into said lower lead conductor, said lower coil conductor, said upper coil conductor and said upper lead conductor are stacked, and brought into conduction with each other.

14. The thin-film common mode filter array as claimed in claim 13, wherein each of said lower lead drawing terminal, said lower coil drawing terminal, said upper coil drawing terminal and said upper lead drawing terminal has a structure where said conductor layers to be patterned into said lower lead conductor and said lower coil conductor are connected to each other via a through hole in a first layer, said conductor layers to be patterned into said lower coil conductor and said upper coil conductor are connected to each other via a through hole in a second layer, said conductor layers to be patterned into said upper coil conductor and said upper lead conductor are connected to each other via a through hole in a third layer, and all of said conductor layers are brought into conduction with each other.

15. The thin-film common mode filter array as claimed in claim 14, wherein centers of said through holes in said first layer to said third layer coincide with each other.

16. The thin-film common mode filter array as claimed in claim 15, wherein said through holes in said first layer to said third layer have sequentially larger dimensions.

17. The thin-film common mode filter array as claimed in claim 15, wherein said through holes in said first layer to said third layer have the same form and the same dimension as each other.

18. The thin-film common mode filter array as claimed in claim 14, wherein each center position of said through holes in said first layer to said third layer is alternately changed.

19. The thin-film common mode filter array as claimed in claim 18, wherein said through holes in said first layer to said third layer have the same form and the same dimension as each other.

20. The thin-film common mode filter array as claimed in claim 12, wherein widths ($W_1$) of said upper and lower lead conductors are less than twice the widths ($W_2$) of said upper and lower coil conductors ($W_1 < 2W_2$).

21. The thin-film common mode filter array as claimed in claim 12, wherein said lower and upper lead conductors are formed of a copper whose external surfaces are covered with nickel/chromium films.

22. The thin film common mode filter array as claimed in claim 21, wherein a surface of said lower lead conductor in a connection portion between said lower coil conductor and said lower lead conductor, and a surface of said upper lead conductor in a connection portion between said upper coil conductor and said upper lead conductor, are covered with only chromium films.

* * * * *